(12) United States Patent
Freeman et al.

(10) Patent No.: US 7,906,871 B2
(45) Date of Patent: Mar. 15, 2011

(54) APPARATUS, SYSTEM, AND METHOD FOR REDUCING POWER CONSUMPTION ON DEVICES WITH MULTIPLE POWER SUPPLIES

(75) Inventors: Joseph W. Freeman, Raleigh, NC (US); Randhir S. Malik, Cary, NC (US); Derek Robertson, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 12/346,261

(22) Filed: Dec. 30, 2008

(65) Prior Publication Data

US 2010/0164292 A1   Jul. 1, 2010

(51) Int. Cl.
*H02J 1/10* (2006.01)
(52) U.S. Cl. .............................. 307/85; 307/43
(58) Field of Classification Search .................. 307/43, 307/85
See application file for complete search history.

(56) References Cited

U.S. PATENT DOCUMENTS

| | | | |
|---|---|---|---|
| 6,166,934 A * | 12/2000 | Kajouke et al. ................. | 363/65 |
| 6,504,266 B1 * | 1/2003 | Ervin .............................. | 307/29 |
| 6,614,133 B2 * | 9/2003 | Belson et al. .................... | 307/58 |
| 6,654,264 B2 * | 11/2003 | Rose ............................... | 363/65 |
| 6,735,704 B1 | 5/2004 | Butka et al. | |
| 7,002,263 B2 * | 2/2006 | Inn et al. ......................... | 307/55 |
| 7,043,648 B2 * | 5/2006 | Tokunaga ...................... | 713/320 |
| 7,243,248 B1 * | 7/2007 | Roux et al. ..................... | 713/300 |
| 7,312,962 B1 | 12/2007 | Zansky et al. | |
| 7,436,950 B2 * | 10/2008 | Chheda et al. ................ | 379/413 |
| 7,443,053 B2 * | 10/2008 | Chen .............................. | 307/44 |
| 7,705,488 B2 * | 4/2010 | Clemo et al. .................... | 307/64 |
| 2004/0003305 A1 | 1/2004 | Tokunaga | |
| 2004/0107273 A1 | 6/2004 | Biran et al. | |
| 2005/0028017 A1 | 2/2005 | Janakiraman et al. | |
| 2006/0208572 A1 | 9/2006 | Zansky et al. | |
| 2009/0134703 A1 * | 5/2009 | Chung et al. .................... | 307/64 |
| 2009/0158070 A1 * | 6/2009 | Gruendler ...................... | 713/340 |
| 2009/0167089 A1 | 7/2009 | Dishman et al. | |
| 2009/0206671 A1 * | 8/2009 | Chang ............................. | 307/65 |
| 2009/0237057 A1 * | 9/2009 | Dishman et al. .............. | 323/285 |
| 2010/0077238 A1 * | 3/2010 | Vogman et al. ............... | 713/310 |

* cited by examiner

*Primary Examiner* — Jared J Fureman
*Assistant Examiner* — Adi Amrany
(74) *Attorney, Agent, or Firm* — Kunzler Needham Massey & Thorpe

(57) ABSTRACT

A load module determines that a load of an electronic device is operating at a power level below a predetermined power threshold. The electronic device is configured to receive power simultaneously from two or more redundant power supplies. Each redundant power supply configured to receive input power from one or more power sources and configured to provide regulated output power to the load of the electronic device. A disconnection module disconnects at least one of the two or more redundant power supplies from the one or more power sources in response to the load module determining that the load of the electronic device is operating at a power level below the predetermined power threshold.

20 Claims, 6 Drawing Sheets

APPARATUS, SYSTEM, AND METHOD FOR REDUCING POWER CONSUMPTION ON DEVICES WITH MULTIPLE POWER SUPPLIES

FIELD OF THE INVENTION

This invention relates to power supplies and more particularly relates to increasing the efficiency of power supplies with multiple power outputs.

BACKGROUND

A power supply, sometimes known as a power supply unit or PSU, is a device or system that supplies electrical or other types of energy to a load or group of loads. A power supply, in some embodiments may be configured to convert power in one form to another form, such as converting alternating current ("AC") power to direct current ("DC") power. The regulation of power supplies is typically done by incorporating circuitry to tightly control the output voltage and/or current of the power supply to a specific value. The specific value is typically closely maintained despite variations in the load presented to the power supply's output, or any reasonable voltage variation at the power supply's input.

For example, in an electronic device such as a computer, the power supply is typically designed to convert an AC voltage input such as is traditionally provided by a conventional wall socket, into several low-voltage DC power outputs for transmission to the internal components of the electronic device. Conversion may be performed in stages that may include various stage-types such as a rectification stage, a pre-regulation stage such as an active harmonic filter, a regulator/chopper stage, etc. The stages may also be configured to utilize various stage-topologies such as a boost stage, a buck stage, or other derivative topology.

In addition to providing main power outputs to various electronic devices, power supplies are often configured to provide auxiliary and standby power to background systems and sub-systems within an electronic device. For example, even when an electronic device is not fully operational, or is in a standby-mode, power may still be needed to power system clocks, system controllers, system monitors and the like. However, conventional power supplies are often configured to operate with optimal efficiency during normal load conditions, but operate with much less efficiency in low-load conditions. Thus, when an electronic device is operating in a standby mode, or other low-load condition, the efficiency of a power supply may be drastically reduced.

This is especially true in systems that utilize multiple redundant power supplies to provide redundancy protection. It is common practice on equipment that requires high availability to be fitted with multiple redundant power supplies. In systems with multiple redundant power supplies, two or more power supplies may be configured to simultaneously provide redundant power to a load caused by the electronic device. Typically, the redundant power supplies are configured to share the load and to provide power to the load in an efficient manner.

Redundant power supplies are usually sized such that if a power supply fails, the remaining power supplies are capable of supplying power to a load fed by the redundant power supplies. For example, if two power supplies are provided, each will typically have enough capacity to supply the load at full capacity. If three power supplies are provided, in a single fault tolerant system, the power supplies are typically sized so that full power to the load may be supplied by two power supplies. One of skill in the art will recognize other combinations and requirements for providing redundant power supplies.

One of the functions provided by the power supplies is to provide standby power to the electronic device when the device is in a low power state or turned off. In such low power states using conventional power supplies, each of the redundant power supplies continues to supply standby power to the now small load of the electronic device, which results in a large drop in efficiency for each of the redundant power supplies.

In addition, even during normal operation each redundant power supply may be operating at much less than full capacity, which may result in each redundant power supply operating at a lower efficiency than if the power supply was operated at a higher capacity. For example, if two redundant power supplies provide power to a load and each is rated at full load, then if the load never operates at more than full capacity, each power supply will typically supply no more than about 50% of the total load. If the load is operating less than full capacity, for example at 50% load, each of the redundant power supplies may operate at only around 25% of rated capacity. Generally power supplies operate less efficiently at lower loads so systems with redundant power supplies often operate inefficiently.

BRIEF SUMMARY

From the foregoing discussion, it should be apparent that there is a need in the art to improve the efficiency of power systems by reducing the power consumption of multiple redundant power supplies that operate to provide power to a light load. The present invention solves the problem by determining when an electronic device enters a low-load state and disconnecting power to one or more of the redundant power supplies such that fewer power supplies operate to provide power to the lighter load. This will reduce the amount of power consumed by redundant power supplies that are not needed for lighter loads and will increase the efficiency of the remaining connected power supplies by allowing them to operate closer to their optimal efficiency range.

The present invention has been developed in response to the present state of the art, and in particular, in response to the problems and needs in the art that have not yet been fully solved by currently available power supplies and regulators. Accordingly, the present invention has been developed to provide an apparatus, system, and method for providing efficient multiple power outputs that overcome many or all of the above-discussed shortcomings in the art.

In one embodiment, the apparatus is provided with a plurality of modules including a load module and a disconnection module. The load module determines that a load of an electronic device is operating at a power level below a predetermined power threshold. The electronic device receives power simultaneously from two or more redundant power supplies. Each redundant power supply receives input power from one or more power sources and provides regulated output power to the load of the electronic device. The redundant power supplies redundantly provide power to the load such that if one of the redundant power supplies fails, the remaining power supplies are capable of supplying power to the load while maintaining regulation of a voltage on a common bus connected to the load.

The disconnection module disconnects at least one of the two or more redundant power supplies from the one or more power sources in response to the load module determining that the load of the electronic device is operating at a power level below the predetermined power threshold.

In a further embodiment, the disconnection module disconnects all but one of the redundant power supplies from the one or more power sources in response to the load module determining that the load of the electronic device is operating at a power level below the predetermined power threshold.

In one embodiment, determining that the load is operating at a power level below the predetermined power threshold includes receiving a standby signal wherein the standby signal indicates that the electronic device is in a standby mode. In another embodiment, determining that the load is operating at a power level below the predetermined power threshold includes monitoring an amount of power provided to the load and detecting whether the amount of power provided to the load is below the predetermined power threshold.

In one embodiment, 'n' is the number of the two or more redundant power supplies required to supply sufficient power to the load to maintain regulation of a voltage on a common bus connected to the load during operation of the load at or below the predetermined power threshold. In such an embodiment, the disconnection module may disconnect all but 'n' of the two or more redundant power supplies from the one or more power sources in response to the load module determining that the load of the electronic device is operating at a power level below the predetermined power threshold.

In another embodiment, 'n' is the number of the two or more redundant power supplies required to supply sufficient power to the load to maintain regulation of a voltage on a common bus connected to the load during operation of the load at a maximum rated capacity of the load. In such an embodiment, the disconnection module may disconnect all but 'n' of the two or more redundant power supplies from the one or more power sources in response to the load module determining that the load of the electronic device is operating at a power level below the predetermined power threshold.

The apparatus may also include a reconnection module that reconnects at least one of the two or more redundant power supplies to the one or more power sources in response to the load module determining that the load of the electronic device is operating at a power level above the predetermined power threshold. In a further embodiment, the reconnection module reconnects all of the disconnected redundant power supplies to the one or more power sources in response to the load module determining that the load of the electronic device is operating at a power level above the predetermined power threshold.

In various embodiments, the disconnection module may include one or more switches configured to selectively disallow input power to flow from the one or more power sources into the redundant power supplies in response to an electrical signal. Preferably, one of the one or more switches is placed at the input of each of the redundant power supplies. This allows input power to the power supplies to be completely disconnected from the power source. Is one embodiment, each of the switches is positioned in a power path of each redundant power supply such that substantially no input power is consumed by any power component in the power path of the power supply during operation of the switch in an 'open' position. The switches may comprise various types of switches such a solid state relay or an electromechanical switch.

A system of the present invention is also presented that substantially includes the modules and embodiments described above with regard to the apparatus. The system typically includes two or more redundant power supplies, a load module, and a disconnection module. As described above, the load module determines that a load of an electronic device is operating at a power level below a predetermined power threshold. The electronic device receives power simultaneously from the two or more redundant power supplies. Each redundant power supply receives input power from one or more power sources and provides regulated output power to the load of the electronic device. The redundant power supplies redundantly provide power to the load such that if one of the redundant power supplies fails, the remaining power supplies are capable of supplying power to the load while maintaining regulation of a voltage on a common bus connected to the load.

The disconnection module disconnects at least one of the two or more redundant power supplies from the one or more power sources in response to the load module determining that the load of the electronic device is operating at a power level below the predetermined power threshold.

The system may further include the electronic device that receives from the redundant power supplies. In one embodiment, the electronic device comprises one of a blade server, peripheral component interconnect ("PCI") card, personal computer, laptop, router, switch, personal digital assistant, appliance, and digital media player.

A method of the present invention is also presented for providing efficient multiple power outputs. The method in the disclosed embodiments substantially includes the steps necessary to carry out the functions presented above with respect to the operation of the described apparatus and system. In one embodiment, the method includes determining that a load of an electronic device is operating at a power level below a predetermined power threshold. The electronic device receives power simultaneously from two or more redundant power supplies. Each redundant power supply receives input power from one or more power sources and provides regulated output power to the load of the electronic device. The redundant power supplies redundantly provide power to the load such that if one of the redundant power supplies fails, the remaining power supplies are capable of supplying power to the load while maintaining regulation of a voltage on a common bus connected to the load.

The method also includes disconnecting at least one of the two or more redundant power supplies from the one or more power sources in response to the load module determining that the load of the electronic device is operating at a power level below the predetermined power threshold. In a further embodiment, disconnecting at least one of the two or more redundant power supplies from the one or more power sources includes disconnecting all but one of the redundant power supplies from the one or more power sources in response to the load module determining that the load of the electronic device is operating at a power level below the predetermined power threshold.

In one embodiment, the method includes reconnecting at least one of the two or more redundant power supplies to the one or more power sources in response to the load module determining that the load of the electronic device is operating at a power level above the predetermined power threshold.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
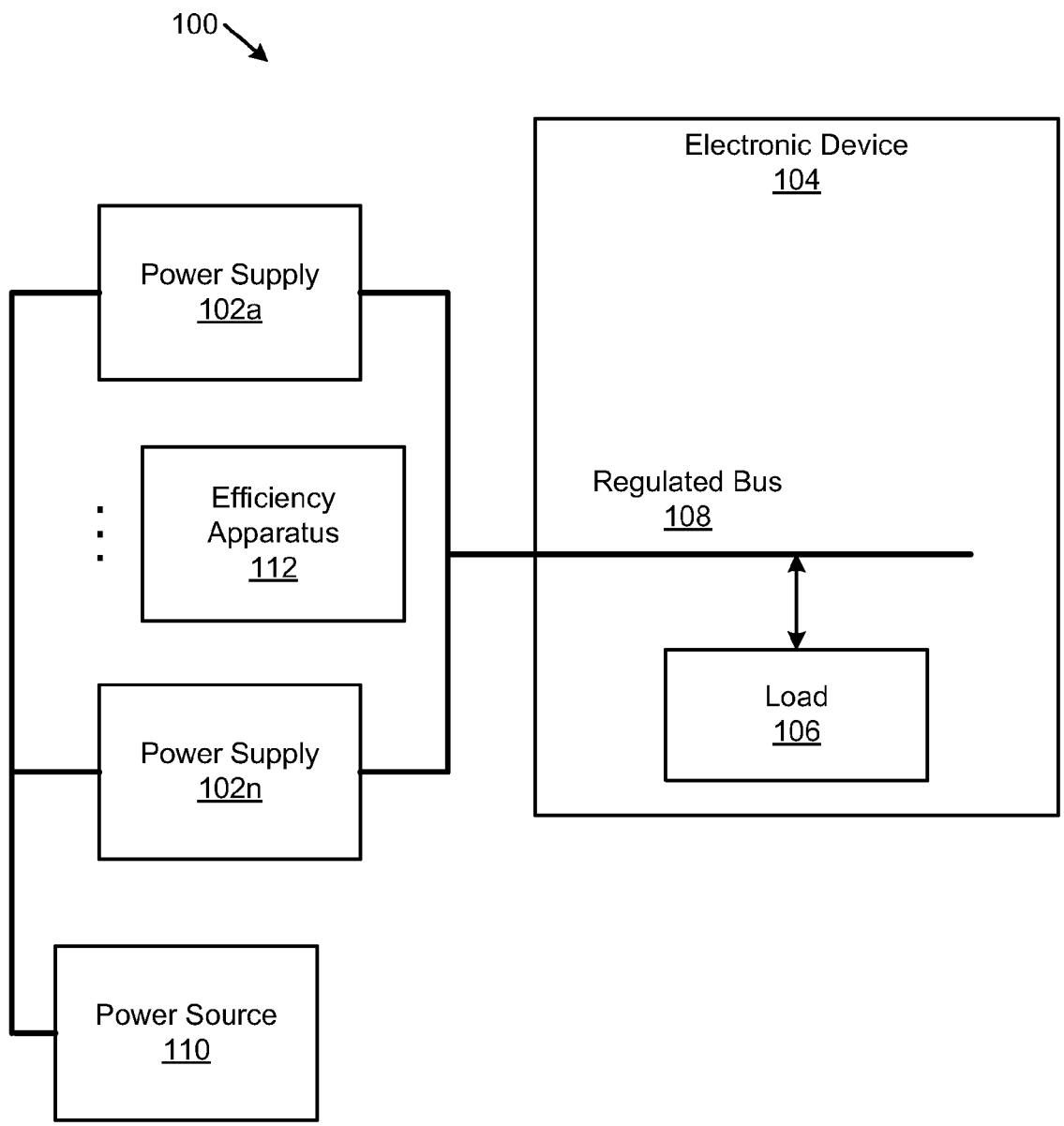
FIG. 1 is a schematic block diagram illustrating one embodiment of a system to increase efficiency on devices with redundant power supplies in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 is a schematic block diagram illustrating one embodiment of a system 100 to increase efficiency on devices with redundant power supplies in accordance with the present invention. The system 100 includes two or more power supplies 102a-n, an electronic device 104, a load 106, a regulated bus 108, a power source 110, and an efficiency apparatus 112.

The power supplies 102a-n provide regulated power to the electronic device 104 to power various electronic systems and subsystems within the electronic device 104. The power supplies 102a-n receive input power from one or more power sources 110 such as a convention wall socket, generator, or additional power supply. The power supplies 102a-n are typically connected to the electronic device 104 by a regulated bus 108 or similar device. The regulated bus 108 and power supplies 102a-n may be configured to provide one or more voltages and currents to the electronic device 104. For example, in a typical power supply, voltages of +12 v, +5 v, +3.3 v, and −12 v are commonly provided. The power supplies 102a-n receive input power from the power source 110 and convert it into regulated voltages as needed to power the electronic device 104.

Preferably the power supplies 102a-n are switching power supplies. As will be recognized by those of skill in the art a switching power supply or switched-mode power supply ("SMPS") is a power supply that incorporates a switching regulator. A switching regulator regulates power by switching a transistor or other switch on and off with a variable duty cycle to produce a desired output signal.

The power supplies 102a-n are also preferably redundant power supplies 102a-n. Dual redundant power supplies 102a-b are typically configured such that if one of the power supplies 102a fails, the remaining power supply 102b is capable of supplying sufficient power to the load 106 while maintaining regulation of a voltage on a common bus 108 connected to the load 106. Typically both redundant power supplies 102a-b are sized to handle the load 106 operating at full capacity.

In some embodiments, more than two power supplies 102a-n may be utilized. For example, a system 100 may include three power supplies 102a-c, each sized such that if one power supply 102a fails, the remaining two power supplies 102b-c can handle the load 106 operating at full capacity. In another embodiment, the system 100 is two fault tolerant and includes multiple power supplies 102a-n. In this example, two power supplies 102n, 102n-1 may fail and the remaining power supplies 102a-102n-2 provide adequate power to the load 106.

Those of skill in the art will recognize that numerous types redundant configurations are possible. For example, it is contemplated that numerous power supplies 102 may be required to provide sufficient power to the load 106, and numerous extra power supplies 102 may be provided to ensure redundancy protection for the system 100.

When utilizing a plurality of redundant power supplies 102a-n it is common for the load 106 to be shared between the power supplies 102a-n as depicted in FIG. 1. In a dual redundant power supply system 100, typically, each power supply 102a-n is configured such that if one power supply 102a fails, the remaining power supply 102b is able to continue providing sufficient power to the load 106. In the example, if two redundant power supplies 102a-b are provided, each power supply 102a-b might provide a maximum of around 50% of the power to the load 106. Thus, it may be desirable to configure the power supplies 102a-b to operate most efficiently when supplying 50% of the power to the load 106. However, many power supplies 102 operate more efficiently at higher loads.

In certain systems 100 with redundant power supplies 102a-n, the system 100 may be able to tolerate a momentary power outage. This momentary outage may be tolerable during normal operation or possibly in a low power state, such as when the system 100 is operating in a standby mode. In this type of system 100, instead of operating all power supplies 102a-n continuously, it may be possible to shut down one or more power supplies 102a-n. In this system 100, when an operating power supply 102a fails, a redundant power supply 102b that has been shut down is then started—possibly resulting in a momentary loss of regulated power. The result of shutting down one or more power supplies 102 is a reduction of power supply-related losses. This higher system efficiency may outweigh any desire to maintain regulation of power on the regulated bus 108 continuously such that a short loss of regulation is acceptable.

In various embodiments, the electronic device 104 may be a computer system, such as a desktop, laptop, or server, and the power supplies 102a-n may be configured to provide power to the various components of the computer system. In other embodiments, the electronic device 104 may include devices such as a blade server, a peripheral component interconnect ("PCI") card, routers, personal digital assistants (PDAs), switches, appliances, digital media players, displays, or other electronic devices as recognized by one of skill in the art. In one embodiment, the power supplies 102a-n may be implemented within the same enclosure as the electronic device 104, such as within a computer tower case. In other embodiments, the power supplies 102a-n may be implemented external to the electronic device 104 and may be connected to the electronic device 104 via a connection means such as a cord, cable, or bus such as in a blade center.

The electronic device 104 operates as a load 106 to the power supplies 102a-n. The amount of load 106 may affect the performance of the power supplies 102a-n. The power supply 102 is typically configured to operate efficiently in conjunction with a specified load 106. Typically, the load 106 varies depending on the operation characteristics of the electronic device 104 and the power supplies 102a-n adjust accordingly. For example, the power supplies 102a-n may include a feedback signal for adjusting the power output characteristics of the power supplies 102a-n in response to changes in the load 106. Typically, the power supply 102a-n regulates the voltage on the regulated bus 108 to provide substantially constant voltage levels to the electronic device 104 under varying load conditions. In various embodiments, the load 106 may be inside the electronic device 104, outside the electronic device 104, or both.

Typically, when the load 106 becomes very light, such as when the electronic device 104 enters a low power mode (ie: standby mode), the power supplies 102a-n become much less efficient due to losses such as switching losses and the like. Thus, When the load 106 becomes light, the power supplies 102a-n are no longer able to operate within their optimal efficiency range, and the result is a drastic reduction in the overall efficiency of the system. This problem is compounded in systems utilizing multiple redundant power supplies 102a-n that share a load 106, because the load 106 is split between power supplies 102. Thus, the overall loss in efficiency can be quite substantial.

The efficiency apparatus 112 in the present invention operates to minimize such efficiency losses during low-load operation of the electronic device 104 by disconnecting input power to unneeded redundant power supplies 102b during low-load or even normal operation of the electronic device 104. This prevents the unneeded power supplies 102b from contributing to power losses and drops in efficiency, and increases the load 106 on the remaining power supplies 102a such that they are able to able operate within a more efficient load range.

Figure 2:
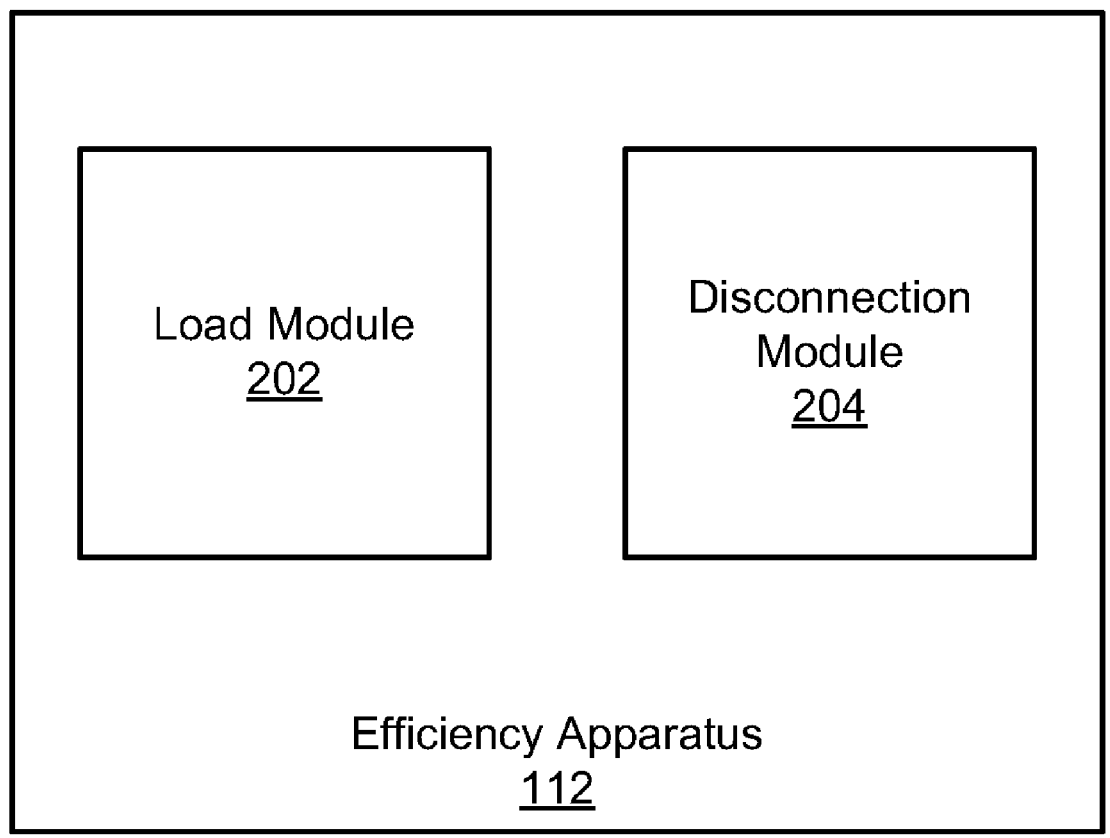
FIG. 2 is a schematic block diagram illustrating one embodiment of an efficiency apparatus to increase efficiency on devices with redundant power supplies in accordance with the present invention.

FIG. 2 is a schematic block diagram illustrating one embodiment of an efficiency apparatus 112 to increase efficiency on devices with redundant power supplies 102a-n in accordance with the present invention. As depicted, the efficiency apparatus 112 includes a load module 202 and a disconnection module 204.

The load module 202 determines that the load 106 of the electronic device 104 is operating at a power level below a predetermined power threshold. Typically, the predetermined power threshold corresponds to a size of the load 106 and is set to indicate a point at which the load 106 becomes so light that the redundant power supplies 102a-n are no longer able to operate within a desired efficiency range. The predetermined power threshold may correspond to operation of the electronic device 104 in a standby mode, hibernate mode, turned off mode, or other low power mode associated with the electronic device 104.

The predetermined power threshold may also correspond to normal operation of the load 106 where the load 106 drops below a predetermined level. For example, where the system includes three power supplies 102a-c, if the load 106 is operating at 30%, the power supplies 102a-c may each provide around 10% of the required power and each power supply 102a-c may be very inefficient at 10% load.

In one embodiment, determining that the load 106 is operating at a power level below the predetermined power threshold may include receiving a standby signal, where the standby signal indicates that the electronic device is in a standby mode. For example, the load 106 of the electronic device 104 during standby operation may be known to be below the predetermined power threshold, and thus a signal indicating operation of the electronic device in standby mode may be sufficient to determine that the load 106 is below the predetermined power threshold. In further embodiments, a shut down signal or hibernate signal may also be received to indicate low-load operation in a similar manner.

In a further embodiment, the load module 202 may monitor an amount of power provided to the load 106 to detect whether the amount of power provided to the load 106 is below the predetermined power threshold. As will be recognized by those of skill in the art, monitoring the amount of power provided to the load 106 may include a utilizing a power meter or other device to determine an amount of power being consumed by the electronic device 104. For example, in one embodiment, the load module 202 measures the input current and input voltage to the electronic device 104 calculates the amount of power from those measurements. In another embodiment, power is measured at an output of the power supplies 102a-n. In some embodiments, the electronic device 104 may have an integrated power meter or other measurement device that provides a signal to the load module 202 indicating an amount of power used by the electronic device 104.

The disconnection module 204 disconnects at least one of the two or more redundant power supplies 102a-n from the one or more power sources 110 in response to the load module 202 determining that the load 106 of the electronic device 104 is operating at a power level below the predetermined power threshold. Thus, once it is determined that the electronic device 104 is operating in a low load mode, the disconnection module disconnects input power to one or more of the power supplies 102 in order to minimize power losses and to increase the load 106 on the remaining power supplies 102. By disconnecting a power supply 102a from the power source 110, typically no substantial amount of power is can be consumed by the disconnected power supply 102a. Thus, switching losses and other power losses are minimized. By increasing the load 106 on the remaining power supplies 102b-n, those power supplies 102b-n will be able to operate more efficiently.

For example, suppose that the load 106 is shared between two power supplies 102a-b and that the power supplies 102a-b are configured to operate most efficiently during normal operation of the electronic device 104. Suppose normal operation of the electronic device 104 typically corresponds to a shared load 106 powered by about 50% of the rated capacity of each power supply 102a-b. If the electronic device 104 enters a standby mode in which the load 106 is reduced such that each power supply 102a-b is now operating at 25% of its rated capacity, then the load module 202 will determine that the load 106 is operating below a predetermined power threshold, and the disconnection module 204 will disconnect one of the power supplies 102a. The remaining power supply 102b will continue to provide power to the load 106 and will be configured to supply all of the power to the load 106 such that the remaining power supply 102b is again operating at 50% of its rated capacity, which corresponds to its high efficiency range. In this manner, the efficiency of the system 100 during low load operation can be dramatically increased.

In one embodiment, there may be many redundant power supplies 102a-n, and the disconnection module 204 may disconnect all but one of the redundant power supplies 102a from the one or more power sources 110 in response to the load module 202 determining that the load 106 of the electronic device 104 is operating at a power level below the predetermined power threshold. For example, in some cases, power supply redundancy may not be needed during low-load operation of the electronic device 104. Therefore, it may be desirable to turn off all but one of the power supplies 102a-n such that a single power supply 102a continues to provide power to the reduced load 106. Further, in some embodiments, more than two power supplies 102a-n may be needed for normal operation of the load 106 to provide sufficient power to the load 106. For example, system 100 may include three power supplies 102a-c and a load 106 may require two power supplies (i.e. 102a-b) to adequately power the load 106. In such cases, it is contemplated that a reduced load 106 may only require a single power supply 102a to provide sufficient power to the load 106.

In another embodiment, 'n' may indicate the number of redundant power supplies 102 required to supply sufficient power to the load 106 in order to maintain regulation of a voltage on a common bus 108 connected to the load 106 during operation of the load 106 at or below the predetermined power threshold. In such an embodiment, the disconnection module 204 may disconnect all but 'n' of the two or more redundant power supplies 102 from the one or more power sources 110 in response to the load module 202 determining that the load 106 of the electronic device 104 is operating at a power level below the predetermined power threshold. For example, suppose a power system includes five redundant powers supplies 102a-e that share a load. Suppose that two power supplies 102a-b are required to provide sufficient power to the load 106 when the load 106 is operated at or at some defined point at or below the predetermined power threshold (ie: n=2). In such a case, the disconnection module 204 may disconnect all but the two power supplies 102a-b needed to supply sufficient power to the light load 106. This helps to increase the efficiency of the system 100 while ensuring that sufficient power is available to power the remaining lighter load 106.

In a further embodiment, 'n' may indicate the number of redundant power supplies 102 required to supply sufficient power to the load 106 to maintain regulation of a voltage on a common bus 108 connected to the load 106 during operation of the load 106 at a maximum rated capacity of the load 106. In this case, the disconnection module 204 may again disconnect all but 'n' of the two or more redundant power supplies 102 from the one or more power sources 110 in response to the load module 202 determining that the load 106 of the electronic device 104 is operating at a power level below the predetermined power threshold.

For example, suppose again that there are five total redundant power supplies 102a-e that share the load 106. Suppose that at least three power supplies 102a-c are needed to provide sufficient power to the load 106 when the load 106 is operated at some predefined maximum capacity (ie: the electronic device 104 is in normal operation with a heavy load), and suppose that only 2 power supplies 102d-e are needed to provide sufficient power to the load 106 when the load 106 is operated below the predetermined power threshold. The disconnection module 204 may disconnect only two power supplies 102d-e such that three power supplies 102a-c continue to provide power to the load 106.

Although the system 100 might be even more efficient if three of the power supplies 102c-e are disconnected, disconnecting only 2 (all but 'n') allows the power supplies 102a-c to more quickly provide additional power to the load 106 should the electronic device 104 resume normal operation with a heavier load 106 or operate at full load. Once a power supply 102 is disconnected, it may require a period of time after the power supply 102 is reconnected before a reconnected power supply 102 begins providing adequate regulated power. Such periods of power loss may be prevented or minimized in the described embodiment.

Figure 3:
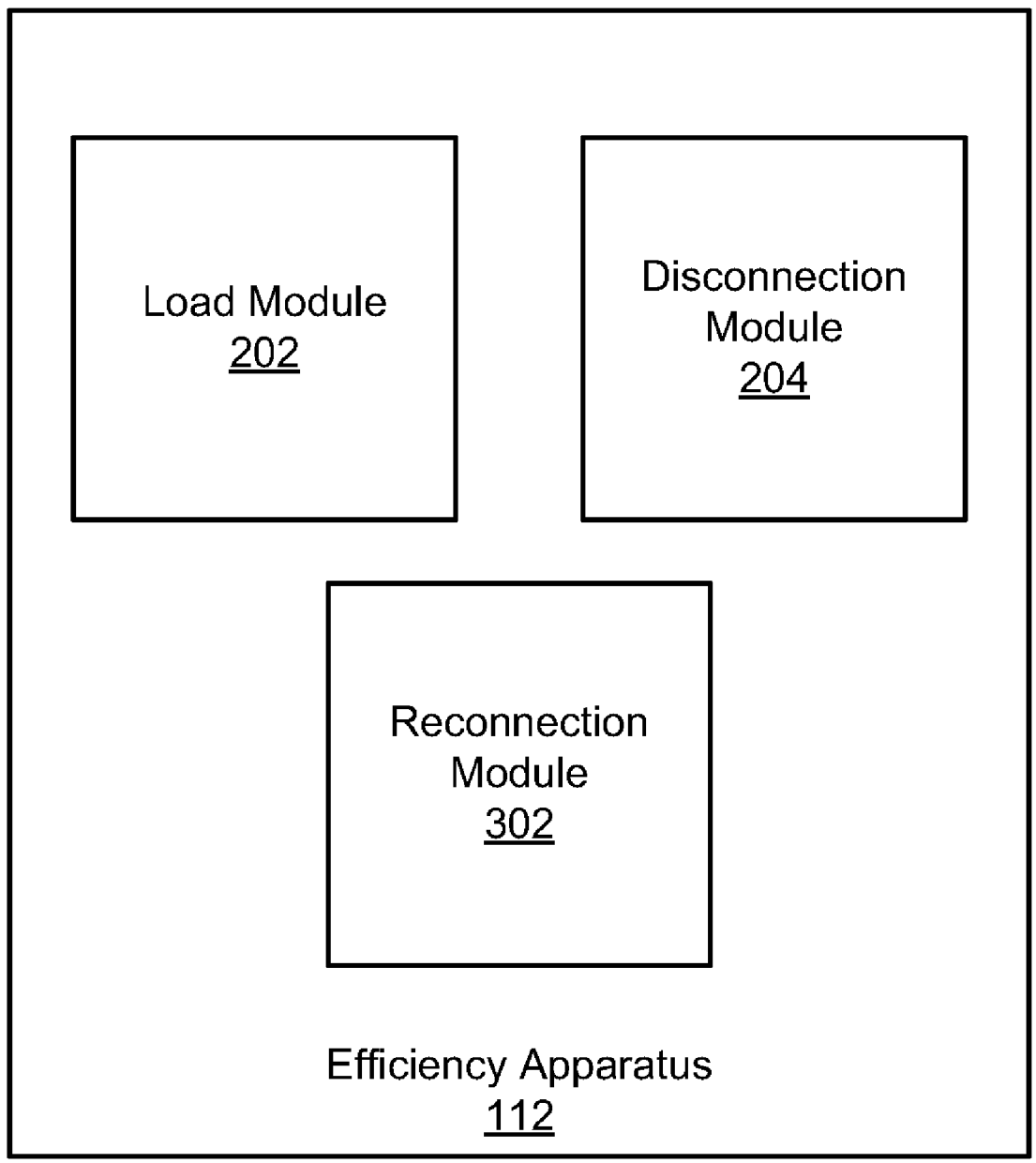
FIG. 3 is a schematic block diagram illustrating another embodiment of an efficiency apparatus to increase efficiency on devices with redundant power supplies in accordance with the present invention.

FIG. 3 is a schematic block diagram illustrating another embodiment of an efficiency apparatus 112 to increase efficiency on devices with redundant power supplies 102a-n in accordance with the present invention. The efficiency apparatus 112 includes a load module 202 and a disconnection module 204 which are substantially similar to those described above in relation to the apparatus 112 of FIG. 2. In the depicted embodiment, the efficiency apparatus 112 also includes a reconnection module 302 which is described below.

The reconnection module 302 is configured to reconnect at least one of the two or more redundant power supplies 102a-n to the one or more power sources 110 in response to the load module 202 determining that the load 106 of the electronic device 104 is operating at a power level above the predetermined power threshold. Thus, the reconnection operates somewhat complementary to the disconnection module 302 and typically allows the system 100 to return to normal operation after some period of operation below the predetermined power threshold. Preferably, the reconnection module 302 reconnects the same number of power supplies 102a-n to the power source 110 as are/were disconnected by the disconnection module 104. For example, the reconnection module may reconnect all of the disconnected redundant power supplies 102a-n to the power source 110 in response to the load 106 returning to operation at or above the predetermined power threshold. In this manner, the system 100 can transition back and forth between low load operation and normal or high load operation.

In various embodiments, the efficiency apparatus 112 includes a time delay, a hysteresis band, or similar mechanism that will allow the reconnection module 302 and/or disconnection module 204 to work together to prevent too frequent connection and disconnection of power supplies 102. For example, the efficiency apparatus 112 may include a feedback loop that is designed with a response time appropriate to prevent chatter caused by switching in and out power supplies 102 too frequently. One of skill in the art will recognize other means to prevent too frequent switching in and out of power supplies 102.

Figure 4:
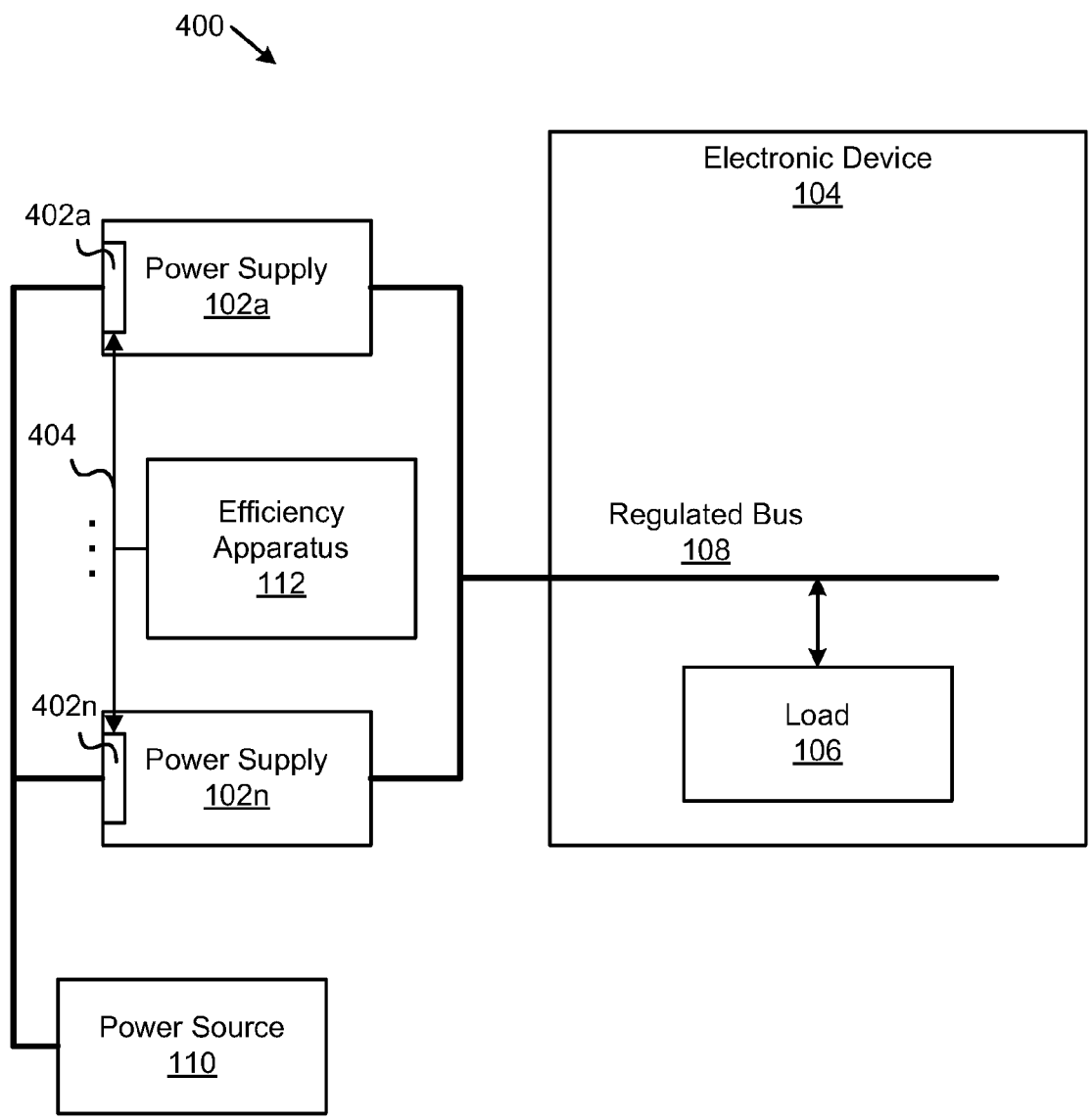
FIG. 4 is a schematic block diagram illustrating a further embodiment of a system to increase efficiency on devices with redundant power supplies in accordance with the present invention.

FIG. 4 is a schematic block diagram illustrating a further embodiment of a system 400 to increase efficiency on devices with redundant power supplies 102a-n in accordance with the present invention. The depicted embodiment includes disconnection devices 402a-n incorporated with the power supplies 102a-n. The disconnection devices 402a-n may be implemented as part of the disconnection module 204, reconnection module 302, or other module in the efficiency apparatus 112 and operate to disconnect the power supplies 102a-n from the power source 110. Typically, a signal 404 is provided to the disconnection devices 102a-n to control operation of the disconnection devices. For example, the disconnection module 204 or reconnection module 302 of the efficiency apparatus 112 may send a signal 404 to the disconnection devices 402a-n causing the devices to either disconnect or reconnect a corresponding power supply 102a-n from its power source 110. Preferably, each disconnection device 402a-n may be operated independently the others.

In one embodiment, the disconnection devices 402a-n might include one or more switches configured to selectively disallow input power to flow from the power source 110 into the corresponding redundant power supplies 102a-n in response to an electrical signal. Preferably, a switch is implemented at the input of each of the redundant power supplies 102a-n. In various embodiments, the switch may be integrated within the power supplies 102a-n are may be implemented as an add-on device. Typically, each of the switches is positioned in a power path of each redundant power supply 102a-n such that substantially no input power is consumed by any power component in the power path of the power supply 102a-n during operation of switch in the 'open' position. The 'open' position meaning that the power supply 102a-n is disconnected from the power source 110.

In one embodiment, each disconnection device 402a-n may include a solid state relay. In another embodiment, the disconnection device 402a-n may include an electromechanical switch, such as a relay. In another embodiment, a disconnection device 402, includes both a solid-state switch and a relay. It is contemplated, and will be recognized by those of skill in the art, that various switches and disconnection devices may be used in accordance with the present invention.

Figure 5:
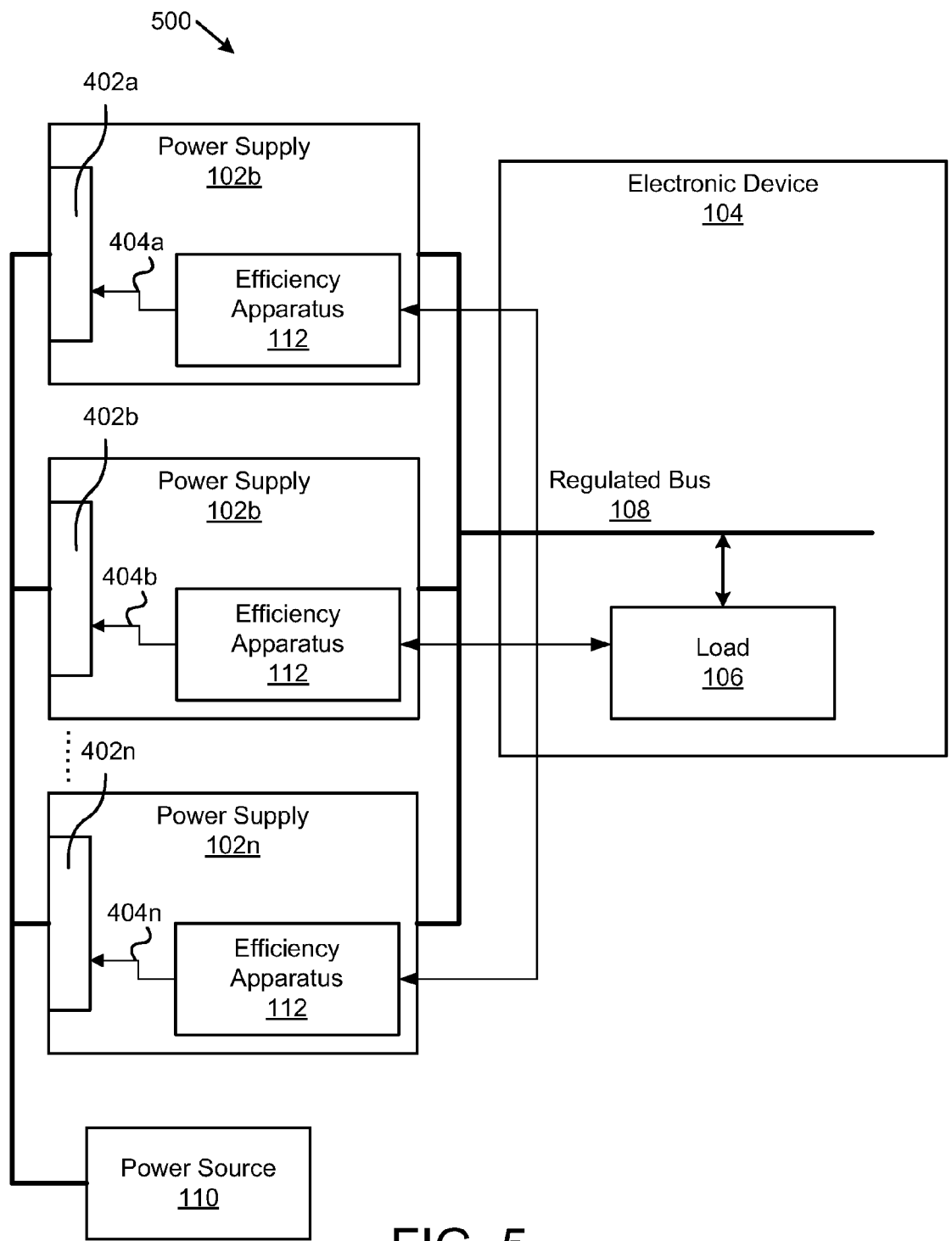
FIG. 5 is a schematic block diagram illustrating another embodiment of a system to increase efficiency on devices with redundant power supplies in accordance with the present invention.

FIG. 5 is a schematic block diagram illustrating another embodiment of a system 500 to increase efficiency on devices with redundant power supplies 102a-n in accordance with the present invention. As has been indicated, the present invention is compatible with the use of numerous redundant power supplies 102a-n. FIG. 5 depicts up to 'n' power supplies 102a-n that are configured for use with the present invention. In the depicted embodiment, the logic modules of the efficiency apparatus 112 are divided among the redundant power supplies 102a-n such that each power supply 102a-n may include all part of the functionality of the efficiency apparatus 112. For example, each power supply 102a-n may include a disconnection module 204 or a portion of a disconnection module as well as all or a portion of a load module 202 or a reconnection module 302, which are substantially similar to those describe above. As depicted, each power supply 102*a-n* includes a corresponding disconnection device 402*a-n* for disconnecting and reconnected the power supplies 102*a-n* from the power source 110.

In other embodiments, the efficiency apparatus 112 may be provided as a standalone or add-on device external to the power supplies 102*a-n* or may be integrated wholly or partially within the power supplies 102*a-n*, electronic device 104, or other components of the system 500.

In operation, the efficiency apparatus 112 operates a load module 202 to determine whether the load 106 is operating below a predetermined threshold. If it is, the efficiency apparatus 112 sends a signal 404*a-n* to independently control each disconnection device 402*a-n* such that one or more of the power supplies 102*a-n* are disconnected from the power source 110. If the load module 202 determines that the load 106 is operating above a predetermined threshold, then one or more of the power supplies 102*a-n* may be reconnected.

In one embodiment, two or more predetermined power thresholds may be utilized in accordance with the present invention. For example, suppose that a first power threshold corresponds to a standby mode of the electronic device 104, and suppose that a second power threshold corresponds to a hibernate mode of the electronic device 104. It is contemplated that one or more power supplies 102*a-n* may be disconnected when the load 106 is operated below the first power threshold, and one or more additional power supplies 102*a-n* may be disconnected when the load 106 is operated below the second power threshold. In this manner, the number of connected power supplies 102*a-n* may be gradually reduced in accordance with the size of the load 106 to increase the efficiency of the system while still providing sufficient power to the load 106.

Figure 6:
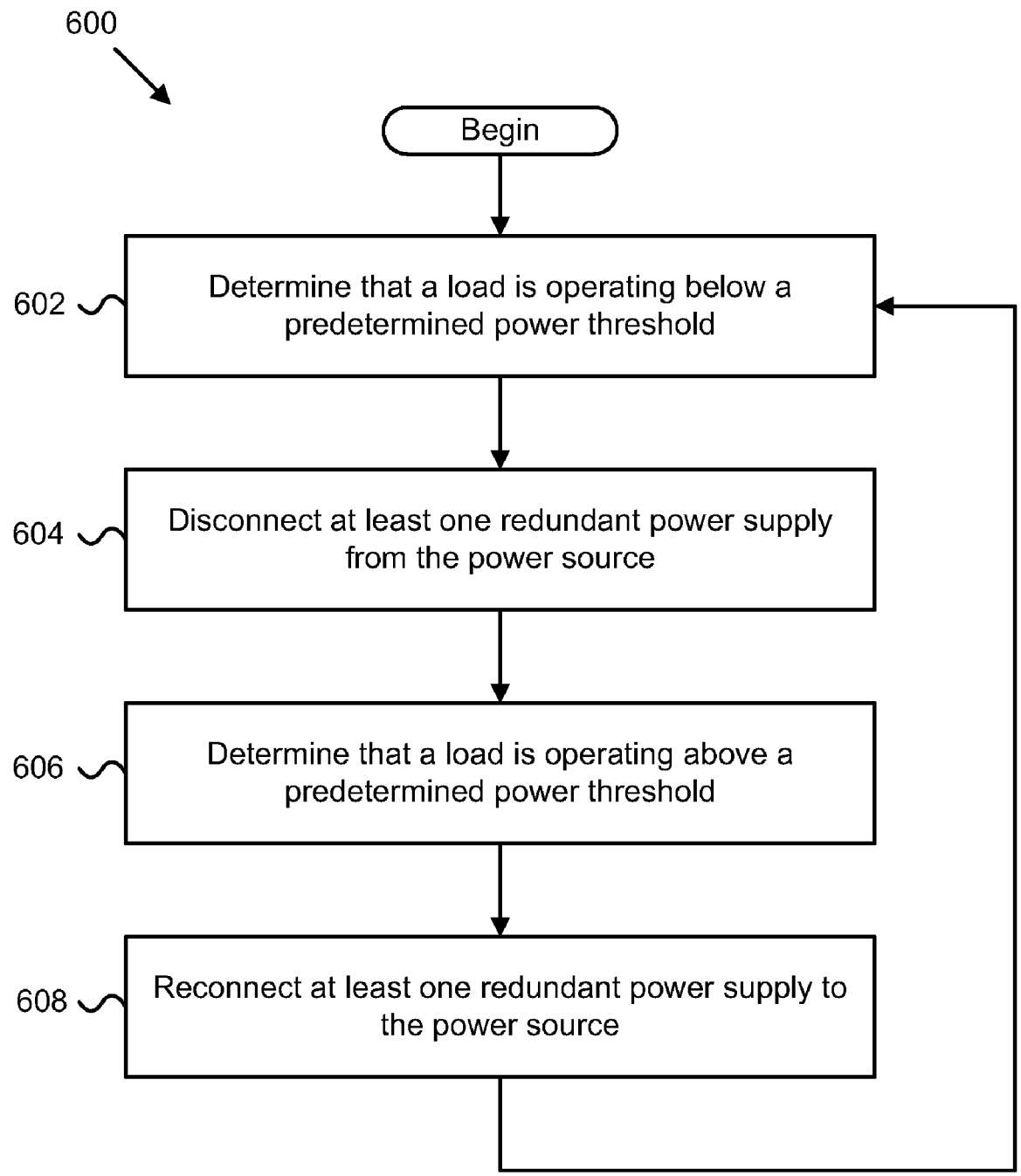
FIG. 6 is a schematic flow chart diagram illustrating one embodiment of a method to increase efficiency on devices with redundant power supplies in accordance with the present invention.

FIG. 6 is a schematic flow chart diagram illustrating one embodiment of a method 600 for providing efficient multiple power outputs in accordance with the present invention. The method 600 substantially includes the embodiments and modules described above with regard to FIGS. 1-5.

The method 600 begins when the load module 202 of an efficiency apparatus 212 determines 602 that a load 106 is operating below a predetermined power threshold. Typically, the predetermined power threshold is a threshold that indicates that an electronic device 104 is operating in a low load mode such as a standby mode. If the load 106 is operating at a power level below the predetermined power threshold, a disconnection module 204 disconnects 604 at least one redundant power supply 102*a* from its power source 110. In one embodiment, all but one of the power supplies 102*a-n* are disconnected from the power source 110. If the load module 202 determines 602 that the load 106 continues to operate below the predetermined threshold, the efficiency apparatus 112 maintains the disconnected power supplies 102 in a disconnected state.

Next, the load module 204 determines 606 that a load 106 is operating at a power level above the predetermined power threshold. In this case, a reconnection module 302 reconnects 608 at least one of the disconnected power supplies 102*a-n* to the power source and normal operation of the system resumes and the method returns to determine 602 whether the load is operating below the predetermined power threshold. If the load module 202 determines 606 that the load 106 continues to operate above the predetermined threshold, the efficiency apparatus 112 maintains the connected power supplies 102 in a connected state. In this manner, the method 600 allows the system 100 to continuously transition between low load modes and normal/high load modes while maintaining efficient operating conditions.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to increase efficiency of electronic devices with redundant power supplies, the power supply comprising:
    a load module that determines that a load of an electronic device is operating at a power level below a predetermined power threshold by receiving a signal from the electronic device indicating that the electronic device is operating in a standby mode, wherein the electronic device is configured to receive power from two or more redundant power supplies, wherein each redundant power supply receives input power from one or more power sources and provides regulated output power to the load of the electronic device, the redundant power supplies redundantly providing power to the load electronic device such that if any one of the redundant power supplies fails, the remaining power supplies are capable of supplying power to the load electronic device while maintaining regulation of a voltage on a common bus connected to the load electronic device, and wherein changes in the power level are caused by changes in operation of the electronic device;
    a disconnection module comprising one or more relays that disconnects all but one of the two or more redundant power supplies from the one or more power sources, such that each redundant power supply that is disconnected does not receive the input power, in response to the load module determining that the load of the electronic device is operating at a power level below the predetermined power threshold; and
    a reconnection module that reconnects at least one redundant power supply that is disconnected to the one or more power sources in response to the load module determining that the load of the electronic device is operating at a power level above the predetermined power threshold.

2. An apparatus to increase efficiency of electronic devices with redundant power supplies, the apparatus comprising:
    a load module that determines that a load of an electronic device is operating at a power level below a predetermined power threshold, wherein the electronic device is configured to receive power from two or more redundant power supplies, wherein each redundant power supply receives input power from one or more power sources and provides regulated output power to the load of the electronic device, the redundant power supplies redundantly providing power to the load such that if any one of the redundant power supplies fails, the remaining power supplies are capable of supplying power to the load while maintaining regulation of a voltage on a common bus connected to the load, and wherein changes in the power level are caused by changes in operation of the electronic device; and
    a disconnection module that disconnects at least one of the two or more redundant power supplies from the one or more power sources, such that the at least one redundant power supply that is disconnected does not receive the input power, in response to the load module determining that the load of the electronic device is operating at a power level below the predetermined power threshold.

3. The apparatus of claim 2, wherein the disconnection module disconnects all but one of the redundant power supplies from the one or more power sources in response to the load module determining that the load of the electronic device is operating at a power level below the predetermined power threshold.

4. The apparatus of claim 2, wherein determining that the load is operating at a power level below the predetermined power threshold comprises receiving a standby signal, the standby signal indicating that the electronic device is in a standby mode.

5. The apparatus of claim 2, wherein determining that the load is operating at a power level below the predetermined power threshold comprises monitoring an amount of power provided to the load and detecting whether the amount of power provided to the load is below the predetermined power threshold.

6. The apparatus of claim 2, wherein 'n' comprises the number of the two or more redundant power supplies required to supply sufficient power to the load connected electronic device to maintain regulation of a voltage on a common bus connected to the load connected electronic device during operation of the load connected electronic device at or below the predetermined power threshold, and wherein the disconnection module disconnects all but 'n' of the two or more redundant power supplies from the one or more power sources in response to the load module determining that the load of the electronic device is operating at a power level is below the predetermined power threshold.

7. The apparatus of claim 2, wherein 'n' comprises the number of the two or more redundant power supplies required to supply sufficient power to the load to maintain regulation of a voltage on a common bus connected to the load during operation of the load at a maximum rated capacity of the load, and wherein the disconnection module disconnects all but 'n' of the two or more redundant power supplies from the one or more power sources in response to the load module determining that the load of the electronic device is operating at a power level below the predetermined power threshold.

8. The apparatus of claim 2, further comprising a reconnection module that reconnects at least one of the two or more redundant power supplies to the one or more power sources in response to the load module determining that the load of the electronic device is operating at a power level above the predetermined power threshold.

9. The apparatus of claim 8, wherein the reconnection module reconnects all of the disconnected redundant power supplies to the one or more power sources in response to the load module determining that the load of the electronic device is operating at a power level above the predetermined power threshold.

10. The apparatus of claim 2, wherein the disconnection module comprises one or more switches configured to selectively disallow input power to flow from the one or more power sources into the redundant power supplies in response to an electrical signal.

11. The apparatus of claim 10, wherein one of the one or more switches is placed at the input of each of the redundant power supplies.

12. The apparatus of claim 11, wherein each of the switches is positioned in a power path of each redundant power supply such that substantially no input power is consumed by any power component in the power path of the power supply during operation of the switch in an 'open' position.

13. The apparatus of claim 10, wherein each switch comprises a solid state relay.

14. The apparatus of claim 10, wherein the switch comprises an electromechanical switch.

15. A system to increase efficiency of electronic devices with redundant power supplies, the system comprising:
   two or more redundant power supplies;
   a load module that determines that a load of an electronic device is operating at a power level below a predetermined power threshold, wherein the electronic device is configured to receive power from the two or more redundant power supplies, wherein each redundant power supply receives input power from one or more power sources and provides regulated output power to the load of the electronic device, the redundant power supplies redundantly providing power to the load such that if any one of the redundant power supplies fails, the remaining power supplies are capable of supplying power to the load while maintaining regulation of a voltage on a common bus connected to the load, and wherein changes in the power level are caused by changes in operation of the electronic device; and
   a disconnection module that disconnects at least one of the two or more redundant power supplies from the one or more power sources, such that the at least one redundant power supply that is disconnected does not receive the input power, in response to the load module determining that the load of the electronic device is operating at a power level below the predetermined power threshold.

16. The system of claim 15, further comprising the electronic device, wherein the electronic device is selectively coupled to the redundant power supplies.

17. The system of claim 16, wherein the electronic device comprises one of a blade server, peripheral component interconnect ("PCI") card, personal computer, laptop, router, switch, personal digital assistant, appliance, and digital media player.

18. A method to increase efficiency of electronics devices with redundant power supplies, the method comprising:
   determining that a load of an electronic device is operating at a power level below a predetermined power threshold, wherein the electronic device is configured to receive power from two or more redundant power supplies, wherein each redundant power supply receives input power from one or more power sources and provides regulated output power to the load of the electronic device, the redundant power supplies redundantly providing power to the load such that if any one of the redundant power supplies fails, the remaining power supplies are capable of supplying power to the load while maintaining regulation of a voltage on a common bus connected to the load, and wherein changes in the power level are caused by changes in operation of the electronic device; and
   disconnecting at least one of the two or more redundant power supplies from the one or more power sources, such that the at least one redundant power supply that is disconnected does not receive the input power, in response to the load module determining that the load of the electronic device is operating at a power level below the predetermined power threshold.

19. The method of claim 18, wherein disconnecting at least one of the two or more redundant power supplies from the one or more power sources comprises disconnecting all but one of the redundant power supplies from the one or more power sources in response to the load module determining that the load of the electronic device is operating at a power level below the predetermined power threshold.

20. The method of claim 18, further comprising reconnecting at least one of the two or more redundant power supplies to the one or more power sources in response to the load module determining that the load of the electronic device is operating at a power level above the predetermined power threshold.

* * * * *